(12) United States Patent
Hirose et al.

(10) Patent No.: US 11,702,725 B2
(45) Date of Patent: Jul. 18, 2023

(54) BONDING STRUCTURE AND METHOD OF MANUFACTURING BONDING STRUCTURE

(71) Applicant: FUJITSU LIMITED, Kawasaki (JP)

(72) Inventors: Shinichi Hirose, Yokohama (JP); Daiyu Kondo, Atsugi (JP)

(73) Assignee: FUJITSU LIMITED, Kanagawa (JP)

( * ) Notice: Subject to any disclaimer, the term of this patent is extended or adjusted under 35 U.S.C. 154(b) by 474 days.

(21) Appl. No.: 16/524,587

(22) Filed: Jul. 29, 2019

(65) Prior Publication Data

US 2020/0061714 A1  Feb. 27, 2020

(30) Foreign Application Priority Data

Aug. 21, 2018  (JP) ................. 2018-154567

(51) Int. Cl.
*B22F 7/04* (2006.01)
*B29C 65/00* (2006.01)
(Continued)

(52) U.S. Cl.
CPC .............. *C22C 26/00* (2013.01); *B22F 1/107* (2022.01); *B22F 7/04* (2013.01);
(Continued)

(58) Field of Classification Search
CPC .. B22F 7/04; B22F 2007/045; B22F 2999/00; B22F 1/0074; B22F 2007/042; B29C 66/72143; B29C 66/742; B29C 66/72141; B29C 66/7214; B29C 66/7212; B29C 66/721; B29C 2045/1692; B29C 70/20; B29C 70/083; B29C 70/16; H05K 7/2039; H01L 23/3733; H01L 21/4871; H01L 23/3732; H01L 23/36; C22C 2026/002; C22C 26/00

See application file for complete search history.

(56) References Cited

U.S. PATENT DOCUMENTS

| 2005/0255304 A1* | 11/2005 | Brink ................ B82Y 30/00 428/209 |
| 2007/0119582 A1* | 5/2007 | Zhang ................ H01L 23/433 165/183 |
| 2010/0172101 A1* | 7/2010 | Yao ................ H05K 7/20481 361/704 |

FOREIGN PATENT DOCUMENTS

| JP | 9-298260 A | 11/1997 |
| JP | 2005-150362 A | 6/2005 |

(Continued)

OTHER PUBLICATIONS

Wang et al. ("Low-temperature sintering with nano-silver paste in die-attached interconnection." journal of electronic materials 36.10 (2007): 1333-1340.) (Year: 2007).*

(Continued)

*Primary Examiner* — Kevin E Yoon
*Assistant Examiner* — Ricardo D Morales
(74) *Attorney, Agent, or Firm* — WHDA, LLP

(57) ABSTRACT

A bonding structure includes: a plurality of carbon nanotubes; a first bonded member, and a first metal sintered compact bonding first end portions of the plurality of carbon nanotubes and the first bonded member, wherein the first metal sintered compact enters spaces between the first end portions of the plurality of carbon nanotubes, and bonds to the plurality of carbon nanotubes while covering side faces and end faces of the first end portions of the plurality of carbon nanotubes.

8 Claims, 10 Drawing Sheets

(51) Int. Cl.
 *H05K 7/20* (2006.01)
 *C22C 26/00* (2006.01)
 *B22F 1/107* (2022.01)

(52) U.S. Cl.
 CPC ...... *B29C 66/72143* (2013.01); *B29C 66/742* (2013.01); *B22F 2007/045* (2013.01); *H05K 7/2039* (2013.01)

(56) References Cited

FOREIGN PATENT DOCUMENTS

| | | | |
|---|---|---|---|
| JP | 2006-147801 A | 6/2006 | |
| JP | 2006-303240 A | 11/2006 | |
| JP | 2012-236739 A | 12/2012 | |
| JP | 2013110217 A * | 6/2013 | |
| JP | 2013-184832 A | 9/2013 | |
| JP | 2013184832 A * | 9/2013 | ............. C01B 31/02 |

OTHER PUBLICATIONS

Knickerbocker et al. ("3D silicon integration." 2008 58th Electronic Components and Technology Conference. IEEE, 2008.). (Year: 2008).*

Chen et al. ("Macroscale and microscale fracture toughness of microporous sintered Ag for applications in power electronic devices." Acta Materialia 129 (2017): 41-51.) (Year: 2017).*

JP-2013110217-A english translation (Year: 2013).*

Office Action dated Apr. 26, 2022, issued in counterpart JP application No. 2018-154567, with English translation. (6 pages).

* cited by examiner

BONDING STRUCTURE AND METHOD OF MANUFACTURING BONDING STRUCTURE

CROSS-REFERENCE TO RELATED APPLICATION

This application is based upon and claims the benefit of priority of the prior Japanese Patent Application No. 2018-154567 filed on Aug. 21, 2018, the entire contents of which are incorporated herein by reference.

FIELD

The present invention relates to a bonding structure and a method of manufacturing a bonding structure.

BACKGROUND

Carbon nanotubes have been developed for various applications because of their excellent conductivity, thermal conductivity, resistance to high temperatures, and flexibility. For example, there has been known a bonding structure in which a sheet-like structure formed of carbon nanotubes partially bonded to each other through cover layers covering the side faces of the carbon nanotubes is bonded to a heat spreader by a metal paste as disclosed in, for example, Japanese Patent Application Publication No. 2012-236739. In addition, there has been known a bonding structure in which a metal member is bonded to both sides of a unidirectional carbon fiber reinforced composite material, in which carbon fibers are arranged in the thickness direction, through a brazing metal as disclosed in, for example, Japanese Patent Application Publication No. H9-298260.

SUMMARY

According to a first aspect of the embodiments, there is provided a bonding structure including: a plurality of carbon nanotubes; a first bonded member; and a first metal sintered compact bonding first end portions of the plurality of carbon nanotubes and the first bonded member, wherein the first metal sintered compact enters spaces between the first end portions of the plurality of carbon nanotubes, and bonds to the plurality of carbon nanotubes while covering side faces and end faces of the first end portions of the plurality of carbon nanotubes.

According to a second aspect of the embodiments, there is provided a method of manufacturing a bonding structure, the method including: forming a first metallic nanopaste containing metal particles on first end portions of a plurality of carbon nanotubes and/or a first bonded member; and forming a first metal sintered compact, which enters spaces between the first end portions of the plurality of carbon nanotubes and covers side faces and end faces of the plurality of carbon nanotubes, to bond the first end portions of the plurality of carbon nanotubes and the first bonded member by the first metal sintered compact by making the first end portions of the plurality of carbon nanotubes and the first bonded member face each other across the first metallic nanopaste and firing the first metallic nanopaste.

According to a third aspect of the embodiments, there is provided a method of manufacturing a bonding structure, the method including: preparing a plurality of carbon nanotubes in sheet form; forming a first metallic nanopaste containing metal particles on a first bonded member: forming a second metallic nanopaste containing metal particles on a second bonded member; forming a first metal sintered compact, which enters spaces between first end portions of the plurality of carbon nanotubes and covers side faces and end faces of the first end portions of the plurality of carbon nanotubes, and a second metal sintered compact, which enters spaces between second end portions of the plurality of carbon nanotubes and covers side faces and end faces of the second end portions of the plurality of carbon nanotubes, to bond the first end portions of the plurality of carbon nanotubes and the first bonded member by the first metal sintered compact and bond the second end portions of the plurality of carbon nanotubes and the second bonded member by the second metal sintered compact by disposing the plurality of carbon nanotubes between the first metallic nanopaste and the second metallic nanopaste and firing the first metallic nanopaste and the second metallic nanopaste simultaneously.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

When carbon nanotubes are bonded to a bonded member with use of a metal paste or a brazing metal, the carbon nanotubes and the bonded member are not firmly bonded in some cases.

Hereinafter, with reference to the accompanying drawings, embodiments of the present disclosure will be described.

First Embodiment

Figure 1A:
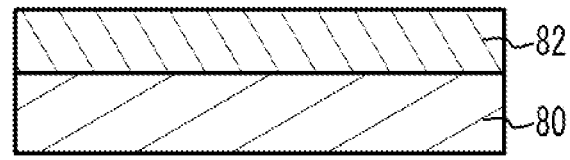
FIG. 1A through FIG. 1D are cross-sectional views illustrating a method of manufacturing a bonding structure in accordance with a comparative example.

A comparative example will be described first. FIG. 1A through FIG. 1D are cross-sectional views illustrating a method of manufacturing a bonding structure in accordance with the comparative example. As illustrated in FIG. 1A, a silver paste 82 is formed on the surface of a heat spreader 80. The silver paste 82 is a mixture in which silver particles are dispersed in a polymer such as a resin binder and a solvent. The silver paste 82 is formed by applying the silver paste 82 or printing the silver paste 82 onto the surface of the heat spreader 80 by, for example, a dispense method or a printing method such as screen printing.

Figure 1B:
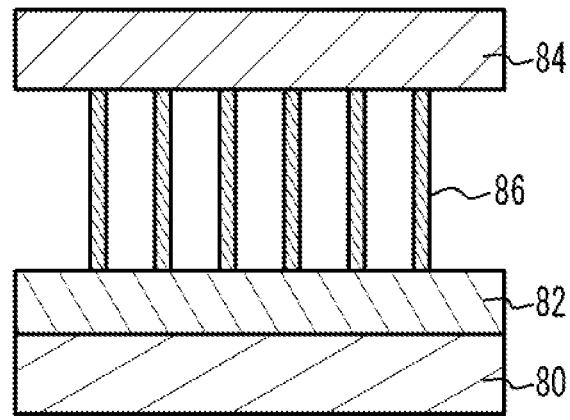

As illustrated in FIG. 1B, carbon nanotubes 86 (hereinafter, referred to as CNTs 86) formed on the surface of a substrate 84 are placed on the silver paste 82 formed on the surface of the heat spreader 80. The CNTs 86 are, for example, carbon nanotubes having metallic properties. Thereafter, the silver paste 82 is heated while the CNTs 86 are placed on the silver paste 82.

Figure 1C:
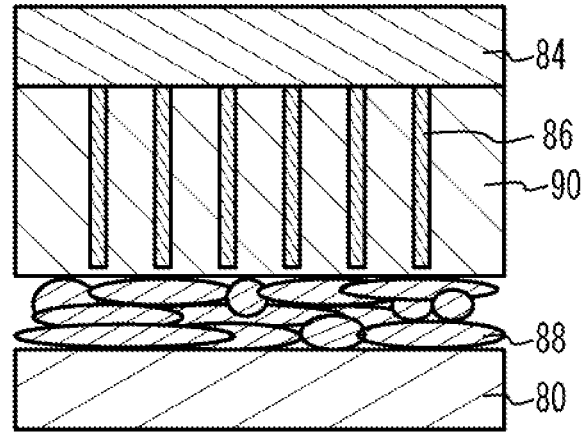

When the silver paste 82 is heated, as illustrated in FIG. 1C, the silver particles contained in the silver paste 82 are sintered to form a metal sintered compact 88, and the heat spreader 80 and the CNTs 86 are bonded by the metal sintered compact 88. In addition, the solvent contained in the silver paste 82 is vaporized, but a polymer such as a resin binder enters spaces of the CNTs 86 by capillarity, and a polymer film 90 is embedded in the spaces of the CNTs 86.

Figure 1D:
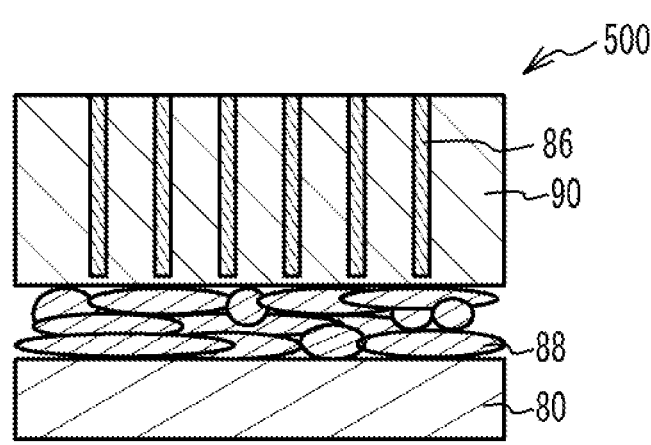

As illustrated in FIG. 1D, the substrate 84 is peeled from the CNTs 86. Through these steps, a bonding structure 500 (a heat dissipation structure) in which the CNTs 86 are bonded to the heat spreader 80 by the metal sintered compact 88 is formed.

In the bonding structure 500 of the comparative example, the spaces of the CNTs 86 are filled with the polymer film 90, and the metal sintered compact 88 that bonds the CNTs 86 and the heat spreader 80 is located between the CNTs 86 and the heat spreader 80. That is, the metal sintered compact 88 is located on the CNTs 86 covered with the polymer film 90. In such a structure, the metal sintered compact 88 is not firmly bonded to the CNTs 86, and the bonding strength between the CNTs 86 and the heat spreader 80 is thereby weak. Even when the CNTs 86 and the heat spreader 80 are bonded by a brazing metal, the particles of the brazing metal are larger than the distance between the CNTs 86. Thus, the brazing metal is placed on the CNTs 86, and thus the bonding strength is weak.

In addition, in the bonding structure 500 of the comparative example, the polymer film 90 is not only embedded in the spaces of the CNTs 86, but also covers the end faces of the CNTs 86. Thus, the CNTs 86 are bonded to the heat spreader 80 through the polymer film 90. Therefore, the electric resistance and the thermal resistance between the CNTs 86 and the heat spreader 80 increase, and fire damage due to heat generation may occur when a current flows.

Figure 2:
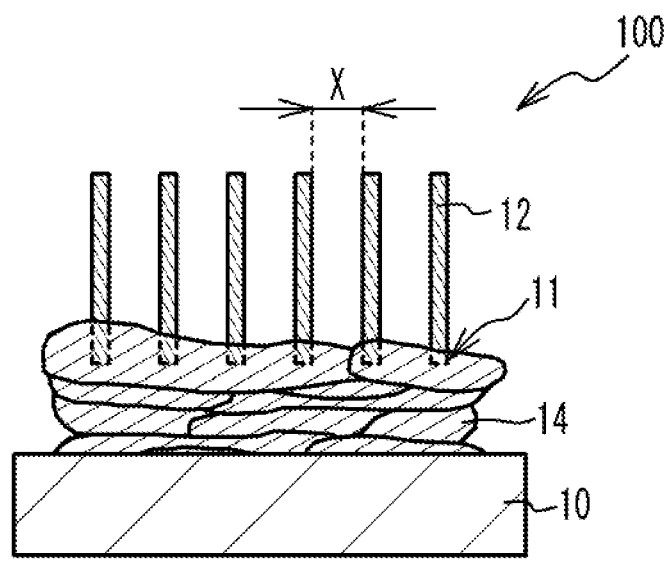
FIG. 2 is a cross-sectional view of a bonding structure in accordance with a first embodiment.

FIG. 2 is a cross-sectional view of a bonding structure in accordance with a first embodiment. As illustrated in FIG. 2, a bonding structure 100 of the first embodiment is a heat dissipation structure including a heat spreader 10, carbon nanotubes 12 (hereinafter, referred to as CNTs 12), and a metal sintered compact 14. The heat spreader 10 is a flat metal plate formed of a material with high thermal conductivity, such as, but not limited to, copper or aluminum.

The CNT 12 may be a single-wall carbon nanotube or a multiwall carbon nanotube. The CNT 12 is, for example, a carbon nanotube having metallic properties, but may be a carbon nanotube having semiconductor properties. The CNT 12 has a length of, for example, approximately 100 μm to 500 μm. The distance X between the CNTs 12 is, for example, approximately 50 nm to 500 nm, and, for example, is approximately 100 nm. The area density of the CNTs 12 is preferably $1.0 \times 10^{10}$ piece/cm$^2$ or greater in terms of heat release performance and electric conductivity. An end portion 11 of the CNT 12 is bonded to the heat spreader 10 by the metal sintered compact 14.

The metal sintered compact 14 is a copper (Cu) sintered compact or a silver (Ag) sintered compact formed by firing a metallic nanopaste containing metallic nanoparticles such as copper (Cu) particles or silver (Ag) particles. The metal sintered compact 14 bonds the heat spreader 10 and the CNTs 12. A first side of the metal sintered compact 14 is bonded to the flat surface of the heat spreader 10, and a second side of the metal sintered compact 14 enters the spaces between the end portions 11 of the CNTs 12 and bonds to the CNTs 12. That is, the metal sintered compact 14 enters the spaces between the end portions 11 of the CNTs 12, and bonds to the CNTs 12 while covering the side faces and the end faces of the CNTs 12. The length of a part covered with the metal sintered compact 14 of the side face of the CNT 12 is, for example, 10 μm or less.

Figure 3:
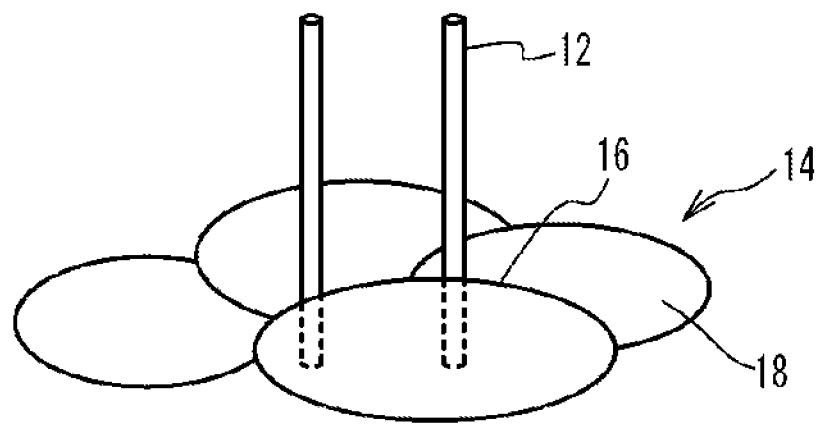
FIG. 3 is a perspective view for describing a bonding state between carbon nanotubes and a metal sintered compact.

FIG. 3 is a perspective view for describing a bonding state between the carbon nanotubes and the metal sintered compact. As illustrated in FIG. 3, the CNTs 12 are trapped in a crystal grain boundary 16 of the metal sintered compact 14, which is a polycrystalline substance, and are bonded to the metal sintered compact 14. In other words, the metal sintered compact 14 has a structure in which adjacent crystal grains 18 are bonded to each other so as to surround the end faces and the side faces of the CNTs 12.

Figure 4A:
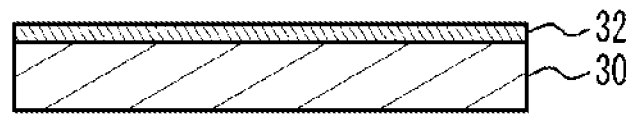
FIG. 4A through FIG. 4D are cross-sectional views (No. 1) illustrating a method of manufacturing the bonding structure in accordance with the first embodiment.

FIG. 4A through FIG. 5C are cross-sectional views illustrating a method of manufacturing the bonding structure in accordance with the first embodiment. As illustrated in FIG. 4A, a catalyst metal film 32 is formed on the surface of a substrate 30 by, for example, sputtering. The substrate 30 may be, but not limited to, a semiconductor substrate such as a silicon substrate, an insulating substrate such as an aluminum oxide substrate, a sapphire substrate, a magnesium oxide substrate, or a glass substrate, or a metal substrate such as a stainless steel substrate. A thin film may be formed on the above-exemplified substrate. For example, the substrate 30 is a silicon substrate with an oxide film. The catalyst metal film 32 may be a film made of iron (Fe) cobalt (Co), nickel (Ni), gold (Au), silver (Ag), or platinum (Pt), or a film made of an alloy including at least one of these metals. For example, the catalyst metal film 32 is an Fe film having a thickness of 2.5 nm. Instead of the catalyst metal film 32, catalyst particles with a desired particle size classified with use of a differential electrostatic classifier may be used.

A ground film may be formed between the substrate 30 and the catalyst metal film 32. The ground film may be a film made of molybdenum (Mo), titanium (Ti), hafnium (Hf), zirconium (Zr), niobium (Nb), vanadium (V), tantalum nitride (TaN), titanium silicide (TiSi$_X$), aluminum (Al), aluminum oxide (Al$_2$O$_3$), titanium oxide (TiO$_X$), tantalum (Ta), tungsten (W), copper (Cu), gold (Au), platinum (Pt), palladium (Pd), or titanium nitride (TiN), or a film made of an alloy including at least one of them. For example, a multilayer structure having an Al film with a thickness of 10 nm and an Fe film with a thickness of 2.5 nm formed on the Al film, a multilayer structure having a TiN film with a thickness of 5 nm and a Co film with a thickness of 2.5 nm formed on the TiN film, or a multilayer structure having a TiN film with a thickness of 5 nm and Co particles with a particle size of 4 nm formed on the CTiN film may be used.

Figure 4B:
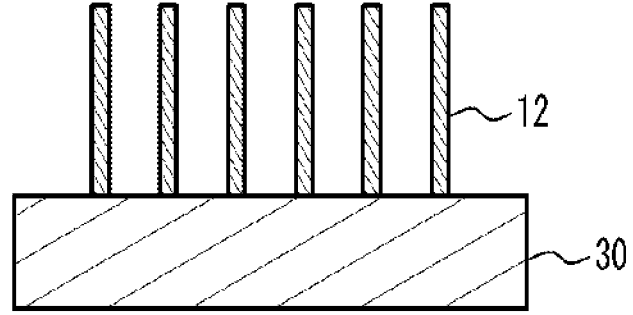

As illustrated in FIG. 4B, the CNTs 12 oriented perpendicularly to the surface of the substrate 30 are grown on the surface of the substrate 30 by, for example, hot filament chemical vapor deposition (CVD) using the catalyst metal film 32 formed on the surface of the substrate 30 as a catalyst. The growth conditions of the CNTs 12 are as follows, for example. A mixed gas of acetylene and argon (partial pressure ratio of 1:9) is used as a material gas, a total gas pressure in a film forming chamber is 1 kPa, a hot filament temperature is 1000° C., and a growth time is 20 minutes. Under the above-described growth conditions, multiwall carbon nanotubes having three to six layers (approximately four layers in average), a diameter of 4 to 8 nm (approximately 6 nm in average), a length of approximately 80 nm, and an area density of approximately $1 \times 10^{11}$ piece/$cm^2$ are formed. The CNTs 12 may be grown by, for example, thermal CVD, plasma CVD, or remote plasma CVD instead of hot filament CVD. A carbon material may be hydrocarbons such as, but not limited to, methane or ethylene, or alcohol such as, but not limited to, ethanol or methanol instead of acetylene. According to the growth mechanism of the CNTs 12, many CNTs 12 of which the tip portions are inclined with respect to the surface of the substrate 30 are formed, and a structure in which the tip portions of the CNTs 12 are mutually entangled is obtained. However, in the drawings here and hereinafter, the illustration of this point is omitted.

Figure 4C:
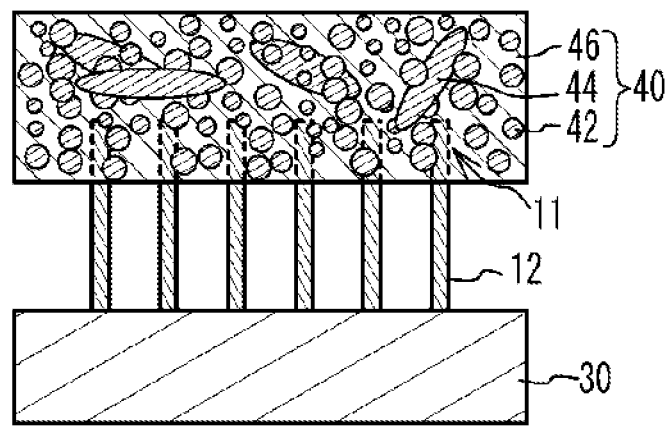

As illustrated in FIG. 4C, a metallic nanopaste 40 is formed on the end portions 11, opposite from the end portions closer to the substrate 30, of the CNTs 12 grown on the surface of the substrate 30. The metallic nanopaste 40 is formed by applying or printing the metallic nanopaste 40 on the end portions 11 of the CNT 12 by, for example, a dispense method or a printing method such as screen printing. The metallic nanopaste 40 is composed of metal nanoparticles 42 having a particle size of a few tens of nanometers, metal powder 44 having a size of several micrometers, and a solvent 46. The metallic nanopaste 40 does not contain a polymer such as a resin binder. The metal powder 44 is used to improve the crystallinity of the metal sintered compact 14 formed in the process illustrated in FIG. 5B described later. The metallic nanopaste 40 may not necessarily contain the metal powder 44, and may be composed of the metal nanoparticles 42 and the solvent 46. The metal nanoparticles 42 and the metal powder 44 are formed of, for example, copper (Cu) or silver (Ag). Here, it is assumed that the metal nanoparticles 42 are copper (Cu) nanoparticles, and the metal powder 44 is copper (Cu) powder. The solvent 46 is, for example, an organic solvent. The particle size of the metal nanoparticle 42 is less than the distance between the CNTs 12. Thus, when the metallic nanopaste 40 is formed on the end portions 11 of the CNTs 12, the metal nanoparticles 42 enter the spaces between the end portions 11 of the CNTs 12.

Figure 4D:
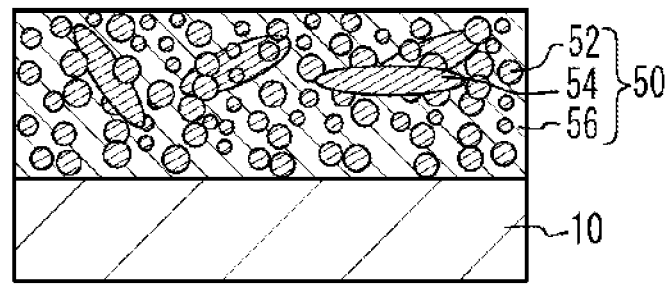

As illustrated in FIG. 4D, a metallic nanopaste 50 is formed on the surface of the heat spreader 10. The metallic nanopaste 50 is formed by applying or printing the metallic nanopaste 50 on the surface of the heat spreader 10 by a dispense method or a printing method such as screen printing. The metallic nanopaste 50 is composed of metal nanoparticles 52 with a particle size of a few tens of nanometers, metal powder 54 with a size of several micrometers, and a solvent 56. The metallic nanopaste 50 does not contain a polymer such as a resin binder. The metal powder 54 is used to improve the crystallinity of the metal sintered compact 14 formed in the step illustrated in FIG. 5B described later. The metallic nanopaste 50 may not necessarily contain the metal powder 54, and may be composed of the metal nanoparticles 52 and the solvent 56. The metal nanoparticles 52 and the metal powder 54 are formed of, for example, copper (Cu) or silver (Ag). Here, it is assumed that the metal nanoparticles 52 are copper (Cu) particles identical to those of the metal nanoparticles 42 of the metallic nanopaste 40 formed on the end portions 11 of the CNTs 12, and the metal powder 54 is copper (Cu) powder identical to that of the metal powder 44 of the metallic nanopaste 40 formed on the end portions 11 of the CNTs 12. The particle size of the metal nanoparticle 52 is equal to that of the metal nanoparticle 42, and is less than the distance between the CNTs 12.

The step of forming the metallic nanopaste 40 on the end portions 11 of the CNTs 12 and the step of forming the metallic nanopaste 50 on the surface of the heat spreader 10 may not necessarily executed both, and it is sufficient if at least one of them is executed.

Figure 5A:
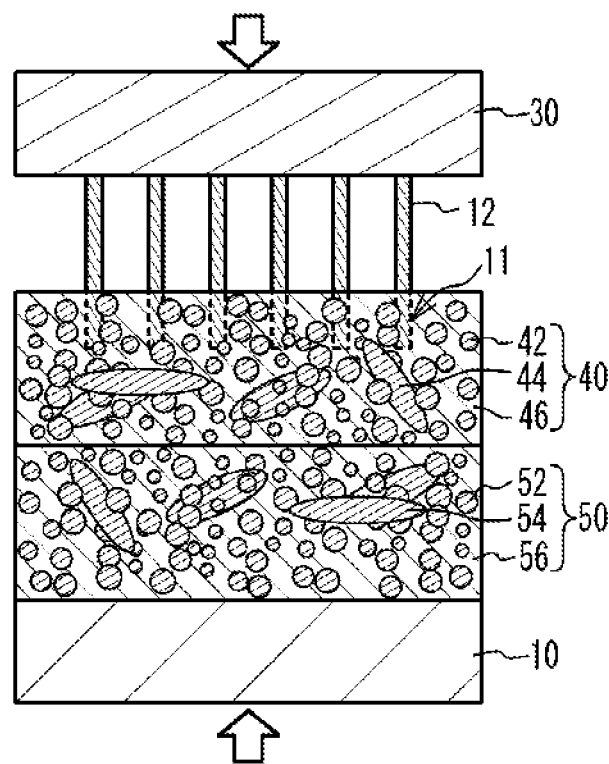
FIG. 5A through FIG. 5C are cross-sectional views (No. 2) illustrating the method of manufacturing the bonding structure in accordance with the first embodiment.

As illustrated in FIG. 5A, the surface of the metallic nanopaste 40, which is formed on the end portions 11 of the CNTs 12, and the surface of the metallic nanopaste 50, which is formed on the heat spreader 10, are attached to each other, and thermocompression bonding is then conducted to fire the metallic nanopastes 40 and 50. The thermocompression bonding can be conducted by maintaining pressing the substrate 30 and the heat spreader 10 against each other at several mega-pascals (MPa) at temperature of 200° C. to 300° C. in a vacuum atmosphere or a noble gas atmosphere such as argon (Ar) for ten and several minutes.

Figure 5B:
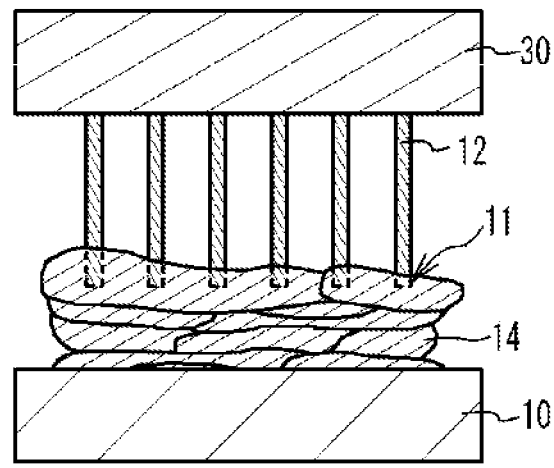

When the metallic nanopastes 40 and 50 are fired through thermocompression bonding, as illustrated in FIG. 5B, the solvents 46 and 56 are vaporized, and the metal nanoparticles 42 and 52 and the metal powders 44 and 54 are sintered to form the metal sintered compact 14. The heat spreader 10 and the CNTs 12 are bonded by the metal sintered compact 14. The metallic nanopastes 40 and 50 do not contain a polymer such as a resin binder, and the particle sizes of the metal nanoparticles 42 and 52 are less than the distance between the CNTs 12. Thus, the spaces of the CNTs 12 are never filled with a polymer film, and the metal sintered compact 14 enters the spaces between the end portions 11 of the CNTs 12, and bonds to the CNTs 12 while covering the side faces and the end faces of the CNTs 12.

Figure 5C:
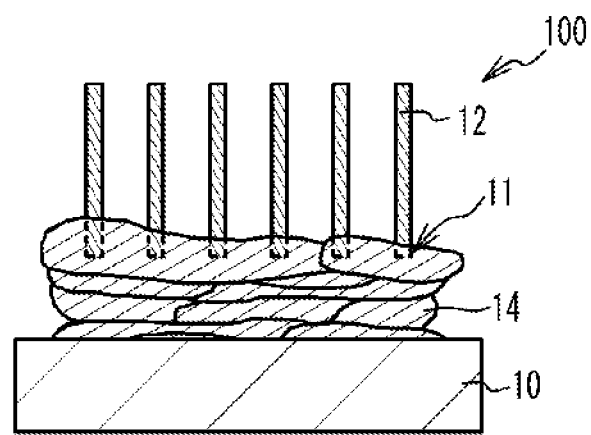

As illustrated in FIG. 5C, after the heat spreader 10 and the CNTs 12 are bonded by the metal sintered compact 14, the substrate 30 is peeled. Through the above-described process, the bonding structure 100 (the heat dissipation structure) of the first embodiment is formed.

In the bonding structure 100 of the first embodiment, the CNTs 12 and the heat spreader 10 are bonded by the metal sintered compact 14 as illustrated in FIG. 2. The metal sintered compact 14 enters the spaces between the end portions 11 of the CNTs 12, and bonds to the CNTs 12 while covering the side faces and the end faces of the end portions 11 of the CNTs 12. The bonding structure 100 of the first embodiment is formed by the following manufacturing method. As illustrated in FIG. 4C and FIG. 4D, the metallic nanopastes 40 and 50 containing the metal nanoparticles 42 and 52 are formed on the end portions 11 of the CNTs 12 and/or the heat spreader 10. As illustrated in FIG. 5A and FIG. 5B, the end portions 11 of the CNTs 12 and the heat spreader 10 are made to face each other across the metallic nanopastes 40 and 50, and the metallic nanopastes 40 and 50 are then fired. Accordingly, the metal sintered compact 14 entering the spaces between the end portions 11 of the CNTs 12 and covering the side faces and the end faces of the CNTs 12 is formed, and the end portions 11 of the CNTs 12 and the heat spreader 10 are bonded by the metal sintered compact 14. Thus, compared with the structure of the comparative example illustrated in FIG. 1 in which the metal sintered compact 88 is placed on the CNTs 86 covered with the polymer film 90, the metal sintered compact 14 can be firmly bonded to the CNTs 12. Therefore, the bond strength between the CNTs 12 and the heat spreader 10 is increased.

In addition, since no polymer film is embedded in the spaces between the CNTs 12, the CNTs 12 and the heat spreader 10 are bonded by the metal sintered compact 14 not through a polymer film. Thus, the thermal resistance and the electric resistance between the CNT 12 and the heat spreader 10 are decreased. Therefore, for example, even when a current flows from the CNT 12 into the heat spreader 10, fire damage due to heat generation is inhibited.

As illustrated in FIG. 3, the CNT 12 is present in the crystal grain boundary 16 of the metal sintered compact 14, and in the metal sintered compact 14, the adjacent crystal grains 18 are bonded to each other so as to cover the end face and the side face of the CNT 12. This structure firmly bonds the metal sintered compact 14 and the CNT 12.

As illustrated in FIG. 4C and FIG. 4D, it is preferable that the metallic nanopaste 40 is formed on the end portions 11 of the CNTs 12, and the metallic nanopaste 50 is formed on the heat spreader 10. This structure allows the CNTs 12 and the heat spreader 10 to be firmly stably bonded by the metal sintered compact 14 by bonding the metallic nanopaste 40 and the metallic nanopaste 50 through thermocompression bonding as illustrated in FIG. 5A and FIG. 5B. Since the CNTs 12 are firmly bonded to the heat spreader 10, the substrate 30 is easily peeled in FIG. 5C.

The metallic nanopastes 40 and 50 preferably contain no polymer. When the metallic nanopastes 40 and 50 contain no polymer, the spaces between the CNTs 12 are not filled with a polymer film. Therefore, the metal sintered compact 14 enters the spaces between the CNTs 12, and easily bonds to the CNTs 12 while covering the side faces and the end faces of the CNTs 12. The metallic nanopastes 40 and 50 may contain a small amount of polymer as long as the metal sintered compact 14 enters the spaces of the CNTs 12 and bonds to the CNT 12 while covering the side faces and the end faces of the CNTs 12.

The length of the part covered with the metal sintered compact 14 of the CNT 12 is preferably 2 µm or greater, more preferably 4 µm or greater, further preferably 6 µm or greater in terms of the bond strength between the CNT 12 and the metal sintered compact 14. On the other hand, as the length of the part covered with the metal sintered compact 14 of the CNT 12 increases, the flexibility of the CNT 12 decreases. Therefore, the length of the part covered with the metal sintered compact 14 of the CNT 12 is preferably 10 µm or less, more preferably 7 µm or less, further preferably 5 µm or less in terms of the flexibility of the CNT 12.

The first embodiment has described a case where the bonded member to be bonded to the end portions 11 of the CNTs 12 by the metal sintered compact 14 is the heat spreader 10 as an example, but does not intend to suggest any limitation. The bonded member to be bonded to the end portions 11 of the CNTs 12 by the metal sintered compact 14 may be other members such as, but not limited to, an electronic component or a circuit board. In addition, the CNTs 12 may be used as wiring lines.

Second Embodiment

Figure 6:
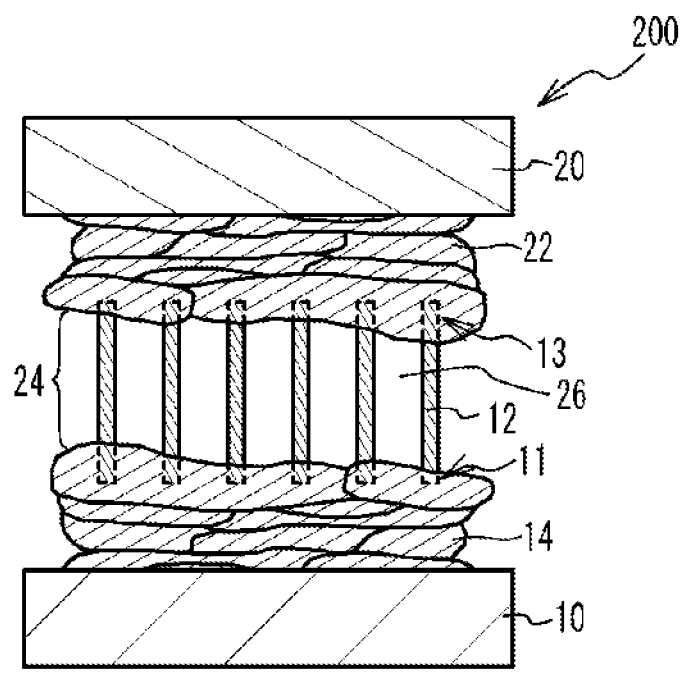
FIG. 6 is a cross-sectional view of a bonding structure in accordance with a second embodiment.

FIG. 6 is a cross-sectional view of a bonding structure in accordance with a second embodiment. As illustrated in FIG. 6, a bonding structure 200 of the second embodiment is an electronic device including the heat spreader 10, the CNTs 12, the metal sintered compact 14, an electronic component 20, and a metal sintered compact 22. The electronic component 20 is, for example, a high power amplifier for a wireless or mobile phone base station, a semiconductor element for a server or personal computer, an onboard Integrated Circuit (IC), or a transistor for driving a motor of a hybrid vehicle or electric vehicle.

The metal sintered compact 22 is a copper (Cu) sintered compact or a silver (Ag) sintered compact formed by sintering a metallic nanopaste containing metal nanoparticles such as copper (Cu) particles or silver (Ag) particles. The metal sintered compact 22 bonds the electronic component 20 and the CNTs 12. A first side of the metal sintered compact 22 is bonded to the electronic component 20, and a second side of the metal sintered compact 22 enters the spaces between end portions 13 of the CNTs 12, and bonds to the CNTs 12. That is, the metal sintered compact 22 enters the spaces between the end portions 13 of the CNTs 12, and bonds to the CNTs 12 while covering the side faces and the end faces of the CNTs 12. The length of the part covered with the metal sintered compact 22 of the side face of the CNT 12 is, for example, 10 µm or less. The metal sintered compact 22 has a structure in which adjacent crystal grains are bonded to each other so as to surround the CNT 12 existing in the crystal grain boundary as with the metal sintered compact 14. In a region 24 between the region where the metal sintered compact 14 is bonded to the CNTs 12 and the region where the metal sintered compact 22 is bonded to the CNTs 12, air gaps 26 are located between the CNTs 12. Other structures are the same as those of the first embodiment, and the description thereof is thus omitted.

Figure 7A:
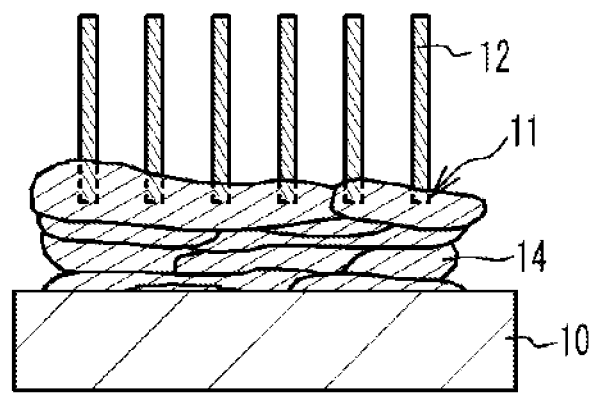
FIG. 7A through FIG. 7C are cross-sectional views (No. 1) illustrating a method of manufacturing the bonding structure in accordance with the second embodiment.

FIG. 7A through FIG. 8B are cross-sectional views illustrating a method of manufacturing the bonding structure in accordance with the second embodiment. As illustrated in FIG. 7A, the steps described in FIG. 4A through FIG. 5C of the first embodiment are conducted to form a structure in which the end portions 11 of the CNTs 12 are bonded to the heat spreader 10 by the metal sintered compact 14.

Figure 7B:
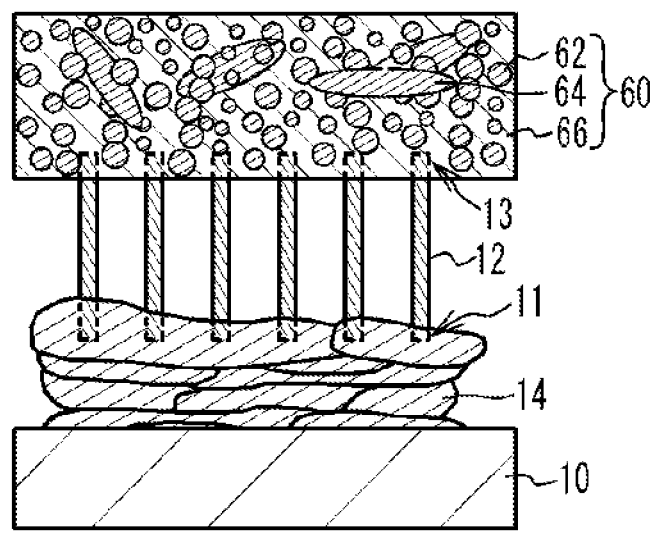

As illustrated in FIG. 7B, a metallic nanopaste 60 is formed on the end portions 13, which are opposite from the end portions 11, of the CNTs 12. The metallic nanopaste 60 is formed by applying or printing the metallic nanopaste 60 on the end portions 13 of the CNTs 12 by, for example, a dispense method or a printing method such as screen printing. The metallic nanopaste 60 is composed of metal nanoparticles 62 with a particle size of a several tens of nanometers, metal powder 64 with a size of several micrometers, and a solvent 66. The metallic nanopaste 60 does not contain a polymer such as a resin binder. The metal powder 64 is used to improve the crystallinity of the metal sintered compact 22 formed in the step illustrated in FIG. 8B described later. The metallic nanopaste 60 may not necessarily contain the metal powder 64, and may be composed of the metal nanoparticles 62 and the solvent 66. The metal nanoparticles 62 and the metal powder 64 are formed of, for example, copper (Cu) or silver (Ag). Here, it is assumed that the metal nanoparticles 62 are copper (Cu) nanoparticles, and the metal powder 64 is copper (Cu) powder. The solvent 66 is, for example, an organic solvent. The particle size of the metal nanoparticle 62 is less than the distance between the CNTs 12. Thus, when the metallic nanopaste 60 is formed on the end portions 13 of the CNTs 12, the metal nanoparticles 62 enter the spaces between the end portions 13 of the CNTs 12.

Figure 7C:
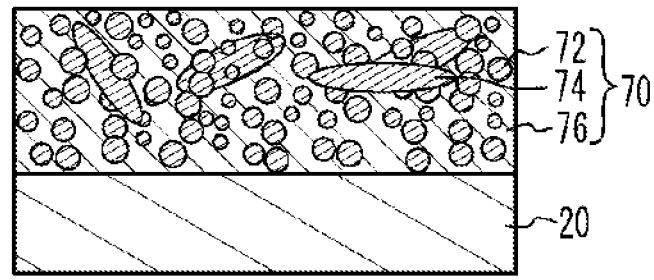

As illustrated in FIG. 7C, a metallic nanopaste 70 is formed on the surface of the electronic component 20. The metallic nanopaste 70 is formed by applying or printing the metallic nanopaste 70 onto the surface of the electronic component 20 by, for example, a dispense method or a printing method such as screen printing. The metallic nanopaste 70 is composed of metal nanoparticles 72 with a particle size of a several tens of nanometers, metal powder 74 with a size of several micrometers, and a solvent 76. The metallic nanopaste 70 does not contain a polymer such as a resin binder. The metal powder 74 is used to improve the crystallinity of the metal sintered compact 22 formed in the step illustrated in FIG. 8B described later. The metallic nanopaste 70 may not necessarily contain the metal powder 74, and may be composed of the metal nanoparticles 72 and the solvent 76. The metal nanoparticles 72 and the metal powder 74 are formed of, for example, copper (Cu) or silver (Ag). Here, it is assumed that the metal nanoparticles 72 are copper (Cu) particles identical to those of the metal nanoparticles 62 of the metallic nanopaste 60 formed on the end portions 13 of the CNTs 12, and the metal powder 74 is copper (Cu) powder identical to that of the metal powder 64 of the metallic nanopaste 60 formed on the end portions 13 of the CNTs 12. The particle size of the metal nanoparticle 72 is equal to that of the metal nanoparticle 62, and is less than the distance between the CNTs 12.

The step of forming the metallic nanopaste 60 on the end portions 13 of the CNTs 12 and the step of forming the metallic nanopaste 70 on the surface of the electronic component 20 may not necessarily be conducted both, and it is sufficient if at least one of them is conducted.

Figure 8A:
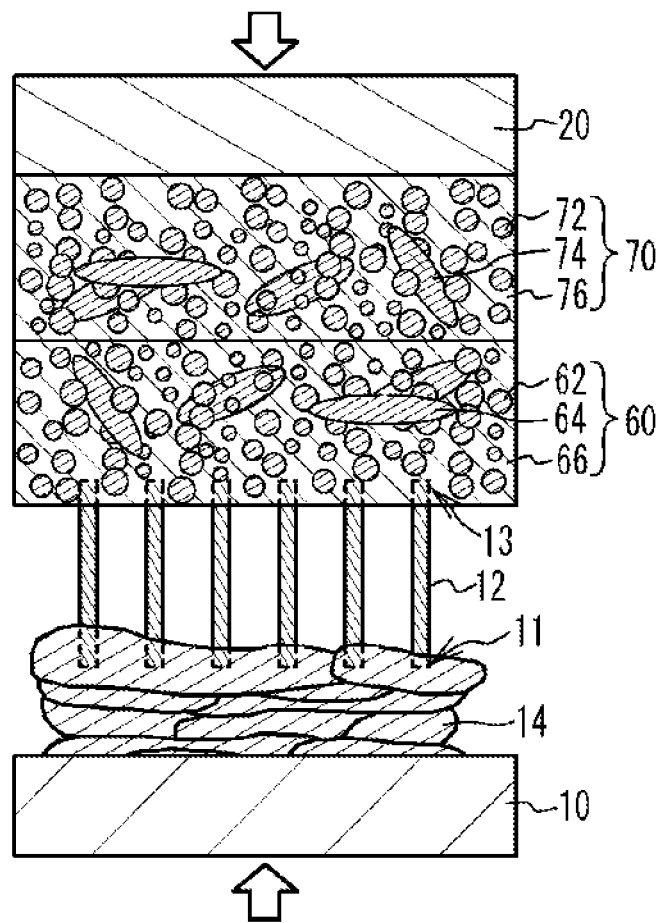
FIG. 8A and FIG. 8B are cross-sectional views (No. 2) illustrating the method of manufacturing the bonding structure in accordance with the second embodiment.

As illustrated in FIG. 8A, the surface of the metallic nanopaste 60, which is formed on the end portions 13 of the CNTs 12, and the surface of the metallic nanopaste 70, which is formed on the electronic component 20, are attached to each other, and thermocompression bonding is then conducted to fire the metallic nanopastes 60 and 70. The thermocompression bonding is conducted by, for example, maintaining pressing the electronic component 20 and the heat spreader 10 against each other at several mega-pascals at a temperature of 200° C. to 300° C. in a vacuum atmosphere or a noble gas atmosphere such as argon (Ar) for ten and several minutes.

Figure 8B:
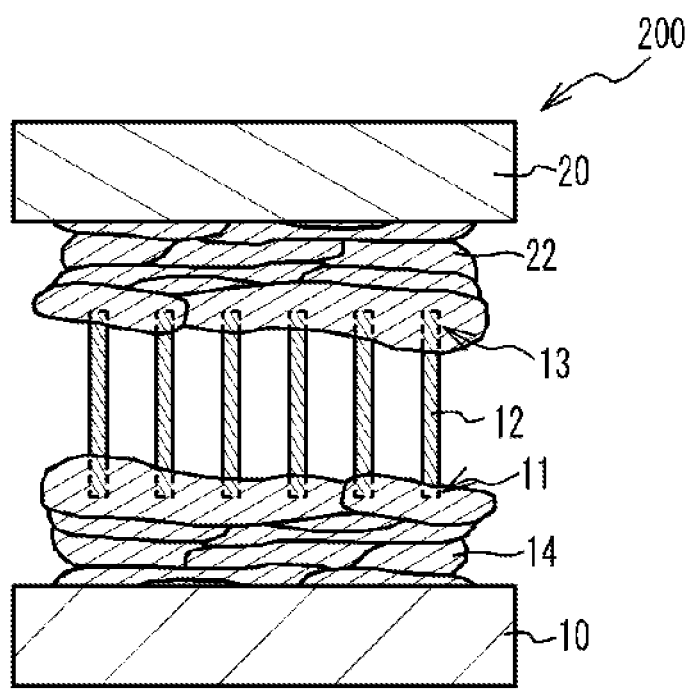

When the metallic nanopastes 60 and 70 are fired through thermocompression bonding, as illustrated in FIG. 8B, the solvents 66 and 76 are vaporized, and the metal nanoparticles 62 and 72 and the metal powders 64 and 74 are sintered to form the metal sintered compact 22. The electronic component 20 and the CNTs 12 are bonded by the metal sintered compact 22. The metallic nanopastes 60 and 70 contain no polymer such as a resin binder, and the particle sizes of the metal nanoparticles 62 and 72 are less than the distance between the CNTs 12. Thus, the spaces of the CNTs 12 are never filled with a polymer film, and the metal sintered compact 22 enters the spaces between the end portions 13 of the CNTs 12, and bonds to the CNTs 12 while covering the side faces and the end faces of the end portions 13 of the CNTs 12. Through the above-described process, the bonding structure 200 (the electronic device) of the second embodiment is formed.

In the second embodiment, as illustrated in FIG. 6, the first end portions 11 of the CNTs 12 are bonded to the heat spreader 10 by the metal sintered compact 14, and the second end portions 13 of the CNTs 12 are bonded to the electronic component 20 by the metal sintered compact 22. The metal sintered compacts 14 and 22 enter the spaces of the CNTs 12, and bond to the CNTs 12 while covering the side faces and the end faces of the CNTs 12. The bonding structure 200 of the second embodiment is formed by adding the following manufacturing steps to the manufacturing steps of the bonding structure 100 of the first embodiment. As illustrated in FIG. 7B and FIG. 7C, the metallic nanopaste 60 containing the metal nanoparticles 62 are formed on the end portions 13 of the CNTs 12 and/or the metallic nanopaste 70 containing the metal nanoparticles 72 are formed on the electronic component 20. As illustrated in FIG. 8A and FIG. 8B, the end portions 13 of the CNTs 12 and the electronic component 20 are made to face each other across the metallic nanopastes 60 and 70, and the metallic nanopastes 60 and 70 are then fired. This process forms the metal sintered compact 22 entering the spaces between the end portions 13 of CNTs 12 and covering the side faces and the end faces of the CNTs 12, and bonds the end portions 13 of CNTs 12 and the electronic component 20 by the metal sintered compact 22. Accordingly, the bond strength between the CNTs 12 and the heat spreader 10 and the bond strength between the CNTs 12 and the electronic component 20 are improved. For example, when a force is applied to the heat spreader 10 and the electronic component 20 in a direction intersecting with the orientation direction of the CNTs 12, the bond strength between the CNTs 12 and the heat spreader 10 and the bond strength between the CNTs 12 and the electronic component 20 are several mega-pascals (MPa) or greater.

The CNT 12 and the heat spreader 10 are bonded by the metal sintered compact 14 not through a polymer film, and the CNT 12 and the electronic component 20 are bonded by the metal sintered compact 22 not through a polymer film. Thus, the thermal resistance and the electric resistance between the electronic component 20 and the heat spreader 10 are reduced. For example, the electric resistivity between the electronic component 20 and the heat spreader 10 is approximately several tens μΩ·cm, and the thermal resistance is 0.03° C./W or less.

As illustrated in FIG. 6, in the region 24 between the region where the metal sintered compact 14 is bonded to the CNTs 12 and the region where the metal sintered compact 22 is bonded to the CNTs 12, the air gaps 26 are located between the CNTs 12. This structure inhibits the reduction in flexibility of the CNT 12. Therefore, even when the temperature of the bonding structure 200 rises and the heat spreader 10 and the electronic component 20 expand according to the thermal expansion coefficients due to the respective materials, the stress caused by the expansion is adsorbed by the CNT 12.

As illustrated in FIG. 7B and FIG. 7C, to firmly stably bond the CNTs 12 and the electronic component 20, it is preferable that the metallic nanopaste 60 is formed on the end portions 13 of the CNTs 12 and the metallic nanopaste 70 is formed on the electronic component 20. After the metallic nanopaste 60 and the metallic nanopaste 70 are bonded through thermocompression bonding, the step of peeling the substrate 30 illustrated in FIG. 5C is not necessary. Therefore, based on this fact, the metallic nanopaste 70 may be formed only on the electronic component 20 on which the metallic nanopaste is easily formed, and the metallic nanopaste 60 may not necessarily be formed on the end portion 13 of the CNT 12. Thus, the number of manufacturing steps is reduced.

The metal sintered compact 14 and the metal sintered compact 22 may not necessarily be formed of the same metal material, and may be formed of different metal materials.

The second embodiment has described a case where the CNTs 12 are bonded to the electronic component 20 after bonded to the heat spreader 10, but does not intend to suggest any limitation. The CNTs 12 may be bonded to the heat spreader 10 after bonded to the electronic component 20. In addition, the second embodiment has described a case where the bonded member to the bonded to the end portions 13 of the CNTs 12 by the metal sintered compact 22 is the electronic component 20, but does not intend to suggest any limitation. The bonded member to be bonded to the end portions 13 of CNTs 12 by the metal sintered compact 22 may be other members such as a circuit board.

Third Embodiment

Figure 9A:
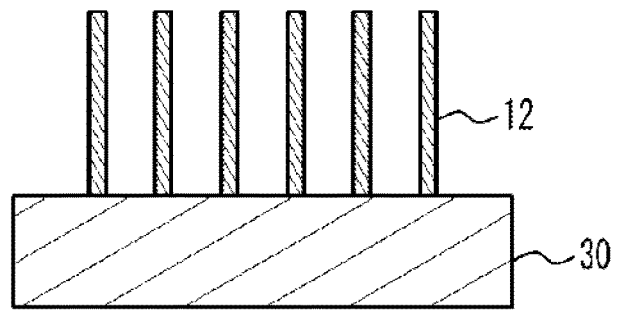
FIG. 9A through FIG. 9D are cross-sectional views (No. 1) illustrating a method of manufacturing a bonding structure in accordance with a third embodiment.

A bonding structure of a third embodiment has the same structure as the bonding structure 200 of the second embodiment illustrated in FIG. 6, and the illustration and the description thereof are thus omitted. FIG. 9A through FIG. 10B are cross-sectional views illustrating a method of manufacturing the bonding structure of the third embodiment. As illustrated in FIG. 9A, the steps described in FIG. 4A and FIG. 4B of the first embodiment are conducted to grow the CNTs 12 oriented perpendicularly to the surface of the substrate 30 on the surface of the substrate 30.

Figure 9B:
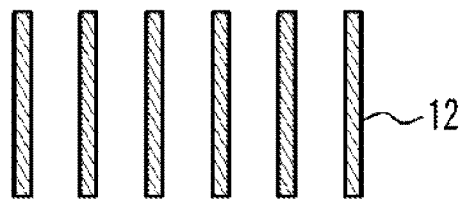

As illustrated in FIG. 9B, the CNTs 12 are peeled from the substrate 30 with use of, for example, a razor. As described above, the tip portions of the CNTs 12 are often inclined with respect to the surface of the substrate 30. Thus, the tip portions of the CNTs 12 are entangled. Thus, even when the CNTs 12 are peeled from the substrate 30, the CNTs 12 do not come apart, and the CNTs 12 in sheet form are obtained.

Figure 9C:
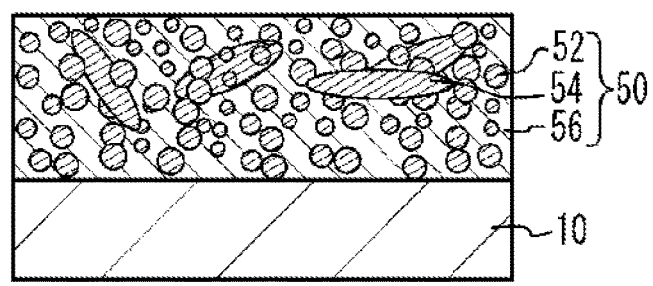

As illustrated in FIG. 9C, the metallic nanopaste 50 is formed on the surface of the heat spreader 10. The step of forming the metallic nanopaste 50 is the same as the step described in FIG. 4D of the first embodiment, and the description thereof is thus omitted.

Figure 9D:
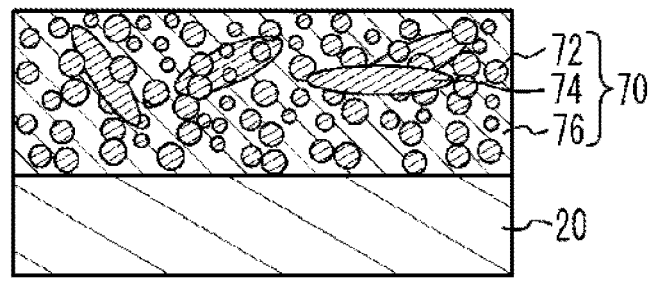

As illustrated in FIG. 9D, the metallic nanopaste 70 is formed on the surface of the electronic component 20. The step of forming the metallic nanopaste 70 is the same as the step described in FIG. 7C of the second embodiment, and the description thereof is thus omitted.

Figure 10A:
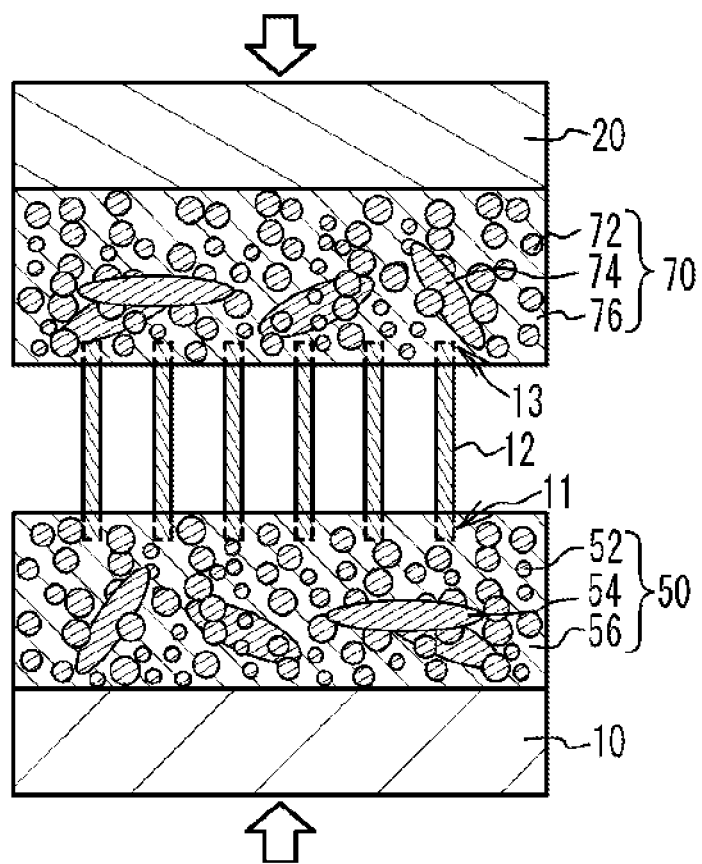
FIG. 10A and FIG. 10B are cross-sectional views (No. 2) illustrating the method of manufacturing the bonding structure in accordance with the third embodiment.

As illustrated in FIG. 10A, the metallic nanopaste 50 formed on the heat spreader 10 and the metallic nanopaste 70 formed on the electronic component 20 are made to face each other across the CNTs 12 in sheet form. In this state, thermocompression bonding is conducted to simultaneously fire the metallic nanopastes 50 and 70. The thermocompression bonding is conducted by, for example, maintaining pressing the electronic component 20 and the heat spreader 10 against each other at several mega-pascals at a temperature of 200° C. to 300° C. in a vacuum atmosphere or a noble gas atmosphere such as argon (Ar) for ten and several minutes. Since the particle sizes of the metal nanoparticles 52 and 72 are less than the distances between the CNTs 12, the metal nanoparticles 52 and 72 respectively enter the spaces between the end portions 11 and the spaces between the end portions 13 of the CNTs 12.

Figure 10B:
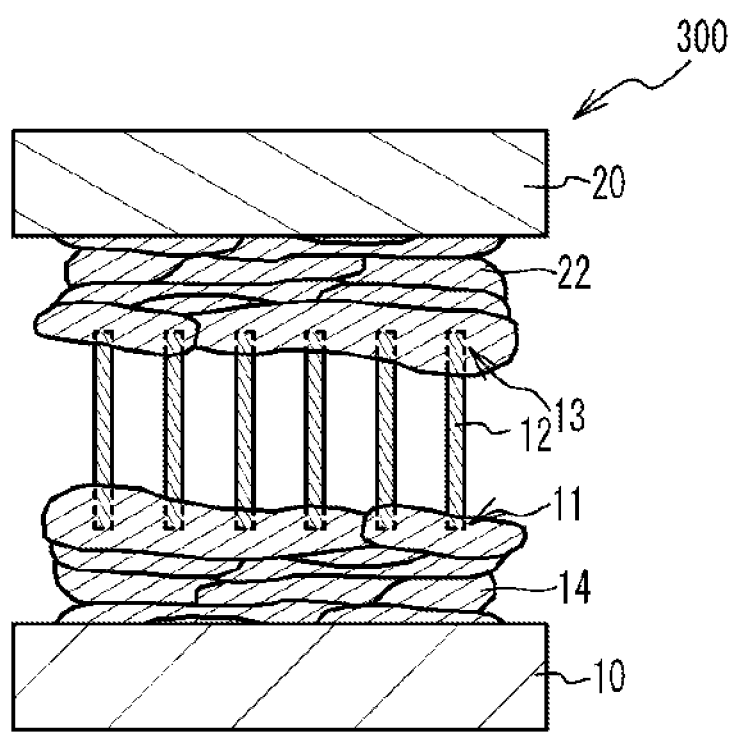

When the metallic nanopastes 50 and 70 are fired through thermocompression bonding, as illustrated in FIG. 10B, the metal nanoparticles 52 and the metal powder 54 are sintered to form the metal sintered compact 14, and the metal nanoparticles 72 and the metal powder 74 are sintered to form the metal sintered compact 22. The solvents 56 and 76 are vaporized. The heat spreader 10 and the CNTs 12 are bonded by the metal sintered compact 14, and the electronic component 20 and the CNTs 12 are bonded by the metal sintered compact 22. The metallic nanopastes 50 and 70 contain no polymer such as a resin binder, and the particle sizes of the metal nanoparticles 52 and 72 are less than the distances between the CNTs 12. Thus, the spaces of the CNTs 12 are never filled with a polymer film, and the metal sintered compact 14 enters the spaces between the end portions 11 of the CNTs 12 and bonds to the CNTs 12 while covering the side faces and the end faces of the end portions 11 of the CNTs 12. The metal sintered compact 22 enters the spaces between the end portions 13 of CNTs 12, and bonds to the CNTs 12 while coveting the side faces and the end faces of the end portions 13 of the CNTs 12. Through the above-described process, a bonding structure 300 (the electronic device) of the third embodiment is formed.

In the third embodiment, as illustrated in FIG. 9B, the CNTs 12 in sheet form are prepared. As illustrated in FIG. 9C, the metallic nanopaste 50 containing the metal nanoparticles 52 is formed on the surface of the heat spreader 10. As illustrated in FIG. 9D, the metallic nanopaste 70 containing the metal nanoparticles 72 is formed on the surface of the electronic component 20. As illustrated in FIG. 10A and FIG. 10B, the CNTs 12 in sheet form are disposed between the metallic nanopaste 50 and the metallic nanopaste 70, and the metallic nanopastes 50 and 70 are then simultaneously fired. This process forms the metal sintered compact 14 entering the spaces between the end portions 11 of the CNTs 12 and coveting the side faces and the end faces of the CNTs 12, and bonds the end portions 11 of the CNTs 12 and the heat spreader 10 by the metal sintered compact 14. This process also forms the metal sintered compact 22 entering the spaces between the end portions 13 of the CNTs 12 and covering the side faces and the end faces of the CNTs 12, and bonds the end portions 13 of CNTs 12 and the electronic component 20 by the metal sintered compact 22. The manufacturing method described above simplifies the manufacturing process compared with the manufacturing method described in the second embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:
1. A bonding structure comprising:
a plurality of carbon nanotubes;
a first bonded member; and
a first bond part bonding first end portions of the plurality of carbon nanotubes and the first bonded member,
wherein the first bond part is mostly composed of a first metal sintered compact,
wherein the first metal sintered compact enters spaces between the first end portions of the plurality of carbon nanotubes, and bonds to the plurality of carbon nanotubes while covering side faces and end faces of the first end portions of the plurality of carbon nanotubes,
wherein in a region which is located on second end portions side of the plurality of carbon nanotubes with respect to a region where the first bond part is bonded to the plurality of carbon nanotubes, air gaps are located between the plurality of carbon nanotubes,
wherein the air gaps are not in contact with the first bonded member, and
wherein each of the plurality of carbon nanotubes has the first end portion covered with the first bond part, the first end portion having a length of 2 μm or greater and 7 μm or less.

2. The bonding structure according to claim 1, wherein the plurality of carbon nanotubes are present in a crystal grain boundary of the first metal sintered compact.

3. The bonding structure according to claim 1, wherein the first bonded member is a heat spreader.

4. The bonding structure according to claim 1, wherein the first metal sintered compact is a copper sintered compact or a silver sintered compact.

5. A bonding structure comprising:
- a plurality of carbon nanotubes;
- a first bonded member;
- a first bond part bonding first end portions of the plurality of carbon nanotubes and the first bonded member;
- a second bonded member; and
- a second bond part bonding second end portions of the plurality of carbon nanotubes and the second bonded member,
- wherein the first bond part is mostly composed of a first metal sintered compact,
- wherein the second bond part is mostly composed of a second metal sintered compact,
- wherein the first metal sintered compact enters spaces between the first end portions of the plurality of carbon nanotubes, and bonds to the plurality of carbon nanotubes while covering side faces and end faces of the first end portions of the plurality of carbon nanotubes,
- wherein the second metal sintered compact enters spaces between the second end portions of the plurality of carbon nanotubes, and bonds to the plurality of carbon nanotubes while covering side faces and end faces of the second end portions of the plurality of carbon nanotubes,
- wherein in a region between a region where the first bond part is bonded to the plurality of carbon nanotubes and a region where the second bond part is bonded to the plurality of carbon nanotubes, air gaps are located between the plurality of carbon nanotubes,
- wherein the air gaps are not in contact with the first bonded member and the second bonded member, and
- wherein each of the plurality of carbon nanotubes has the first end portion covered with the first bond part and the second end portion covered with the second bond part, the first end portion and the second end portion having a length of 2 μm or greater and 7 μm or less.

6. The bonding structure according to claim 5, wherein the second bonded member is an electronic component.

7. The bonding structure according to claim 5, wherein the second metal sintered compact is formed of a same material as the first metal sintered compact.

8. The bonding structure according to claim 1,
- wherein the first bond part is only composed of the first metal sintered compact.

* * * * *